US011145686B2

(12) United States Patent
Sidorov et al.

(10) Patent No.: US 11,145,686 B2
(45) Date of Patent: Oct. 12, 2021

(54) SEMICONDUCTOR PHOTODETECTOR DEVICE WITH PROTECTION AGAINST AMBIENT BACK LIGHT

(71) Applicant: ams AG, Premstaetten (AT)

(72) Inventors: Victor Sidorov, Premstaetten (AT); Jong Mun Park, Premstaetten (AT); Eugene G. Dierschke, Premstaetten (AT)

(73) Assignee: AMS AG, Premstaetten (AT)

( * ) Notice: Subject to any disclaimer, the term of this patent is extended or adjusted under 35 U.S.C. 154(b) by 41 days.

(21) Appl. No.: 16/621,140

(22) PCT Filed: Jun. 25, 2018

(86) PCT No.: PCT/EP2018/066936
§ 371 (c)(1),
(2) Date: Dec. 10, 2019

(87) PCT Pub. No.: WO2019/002197
PCT Pub. Date: Jan. 3, 2019

(65) Prior Publication Data
US 2020/0251520 A1   Aug. 6, 2020

Related U.S. Application Data

(60) Provisional application No. 62/525,501, filed on Jun. 27, 2017.

(30) Foreign Application Priority Data

Jul. 26, 2017 (EP) .................................... 17183342

(51) Int. Cl.
*H01L 27/146* (2006.01)
*H01L 31/103* (2006.01)

(52) U.S. Cl.
CPC .... *H01L 27/14638* (2013.01); *H01L 27/1463* (2013.01); *H01L 27/14603* (2013.01); *H01L 27/14654* (2013.01); *H01L 31/103* (2013.01)

(58) Field of Classification Search
CPC .......... H01L 27/14654; H01L 27/1463; H01L 31/103; H01L 27/14638; H01L 27/14623
See application file for complete search history.

(56) References Cited

U.S. PATENT DOCUMENTS 5,162,887 A * 11/1992 Dierschke ......... H01L 27/14647
257/463
7,110,028 B1 * 9/2006 Merrill .............. H01L 27/14603
257/E27.131

(Continued)

FOREIGN PATENT DOCUMENTS

EP           2244296       * 10/2010   ......... H01L 27/1463

OTHER PUBLICATIONS

European Patent Office, International Search report for PCT/EP2018/066936 dated Sep. 3, 2018.

*Primary Examiner* — Younes Boulghassoul
(74) *Attorney, Agent, or Firm* — MH2 Technology Law Group LLP

(57) ABSTRACT

The semiconductor photodetector device comprises a substrate of semiconductor material of a first type of electric conductivity, an epitaxial layer of an opposite second type of electric conductivity, a further epitaxial layer of the first type of electric conductivity and photodetectors. The epitaxial layer functions as a shielding layer for charge carriers ($e^-$, $h^+$ generated by radiation that is incident from a rear side opposite the photodetectors.

8 Claims, 1 Drawing Sheet

(56) References Cited

U.S. PATENT DOCUMENTS

| | | | |
|---|---|---|---|
| 7,388,187 B1* | 6/2008 | Liu | H01L 27/1463 250/208.1 |
| 2003/0080280 A1 | 5/2003 | Takimoto et al. | |
| 2005/0101073 A1 | 5/2005 | Bae et al. | |
| 2005/0133825 A1* | 6/2005 | Rhodes | H01L 27/1463 257/204 |
| 2007/0045668 A1* | 3/2007 | Brady | H01L 27/14603 257/219 |
| 2008/0138926 A1* | 6/2008 | Lavine | H01L 27/14632 438/59 |
| 2011/0068429 A1* | 3/2011 | Venezia | H01L 27/1464 257/443 |
| 2012/0248560 A1 | 10/2012 | Lee et al. | |
| 2017/0141145 A1* | 5/2017 | Yamashita | H01L 27/1462 |
| 2017/0271384 A1* | 9/2017 | Zheng | H01L 27/14623 |

\* cited by examiner

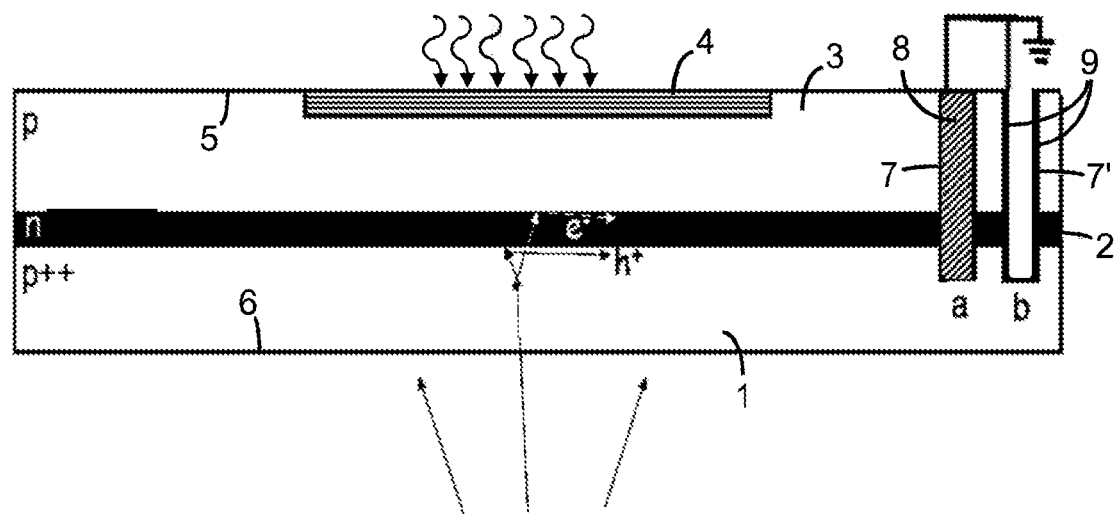

SEMICONDUCTOR PHOTODETECTOR DEVICE WITH PROTECTION AGAINST AMBIENT BACK LIGHT

BACKGROUND OF THE INVENTION

U.S. Pat. No. 5,162,887 discloses a buried P—N junction photodiode with a heavily N-doped region embedded between a first P-doped EPI layer and a second P-doped EPI layer, which are grown on a heavily P-doped substrate. A contact to the heavily N-doped region is provided by a further N-doped region, which extends from the surface of the device to the heavily N-doped region, and a heavily N-doped contact region within the further N-doped region at the surface of the device. The photodiode is compatible with bipolar and CMOS processes.

In a photodetector device comprising an extremely thin substrate, unwanted backside illumination can create free carriers in the substrate, below the active area of the photodetector. These charge carriers drift partially toward the active area and thus cause distortions of the output signal. Photosensitive devices are usually protected against unwanted light by additional process steps including a non-transparent coating and patterning of this coating.

US 2012/0248560 A1 discloses an image sensor including a semiconductor substrate, a plurality of separate photo detecting elements in an upper portion of the substrate, and a backside protection pattern formed in a lower portion of the substrate between the photo detecting elements.

SUMMARY OF THE INVENTION

A shielding layer is provided as part of an epitaxial semiconductor layer structure. These layers act as a pnp bipolar transistor in a closed state. The shielding layer is produced before fragile membranes are created, even before any processing takes place. Hence no deposition, lithography or patterning of non-transparent shielding coating on a fragile thin substrate (membrane) is needed, and the risk of mechanical damage of active areas during fabrication process is substantially reduced.

The semiconductor photodetector device comprises a substrate of semiconductor material of a first type of electric conductivity, an epitaxial layer on the substrate, a further epitaxial layer on the epitaxial layer, so that the epitaxial layer is arranged between the substrate and the further epitaxial layer, and a photodetector or plurality of photodetectors arranged in the substrate or in the further epitaxial layer. The epitaxial layer is doped for a second type of electric conductivity, which is opposite to the first type of electric conductivity. The further epitaxial layer is doped for the first type of electric conductivity.

In particular, the substrate may be more highly doped for the first type of electric conductivity than the further epitaxial layer. The first type of electric conductivity may be p-type conductivity and the second type of electric conductivity n-type conductivity, or vice versa.

In an embodiment of the semiconductor photodetector device, the photodetector or plurality of photodetectors is arranged in the further epitaxial layer.

In a further embodiment an electric conductor shorts the substrate, the epitaxial layer and the further epitaxial layer.

A further embodiment comprises a trench in the epitaxial layer and the further epitaxial layer, the trench reaching to the substrate. A metallization in the trench forms the electric conductor shorting the substrate, the epitaxial layer and the further epitaxial layer. A filling of electrically conductive polysilicon of the first type of conductivity may be employed instead of the metallization.

In a further aspect of the invention, the semiconductor photodetector device comprises a substrate of semiconductor material, the substrate being doped for a first type of electric conductivity, an epitaxial layer on the substrate, the epitaxial layer being doped for a second type of electric conductivity, which is opposite to the first type of electric conductivity, a further epitaxial layer on the epitaxial layer, the further epitaxial layer being doped for the first type of electric conductivity, the epitaxial layer being arranged between the substrate and the further epitaxial layer, and a functional region of the further epitaxial layer, the functional region including a photodetector or plurality of photodetectors and an integrated circuit.

In embodiments of the device, the substrate is more highly doped than the further epitaxial layer. In further embodiments, the first type of electric conductivity may especially be p-type conductivity, and the second type of electric conductivity n-type conductivity.

In further embodiments, a trench is formed in the epitaxial layer and the further epitaxial layer, the trench reaching to the substrate. An electric conductor is arranged in the trench to short the substrate, the epitaxial layer and the further epitaxial layer.

BRIEF DESCRIPTION OF THE DRAWING

The following is a detailed description of examples of the semiconductor photodetector device in conjunction with the appended FIGURE, which is a cross-section of a semiconductor photodetector device comprising an epitaxial shielding layer.

DETAILED DESCRIPTION

The appended FIGURE is a cross-section of a semiconductor photodetector device on a substrate 1 of semiconductor material, which can be silicon, for instance. The substrate 1 is doped, and may especially be heavily doped, for a first type of electric conductivity, which may in particular be p-type conductivity.

An epitaxial layer 2 is formed on the substrate 1 by an epitaxial growth of suitable semiconductor material, which may especially be the same kind of semiconductor material as the semiconductor material of the substrate 1, in particular silicon. The epitaxial layer 2 is doped for a second type of electric conductivity, which is opposite to the first type of electric conductivity. If the first type of electric conductivity is p-type conductivity, the second type of electric conductivity is n-type conductivity. These types of electric conductivity are indicated in the FIGURE by way of example. The types of conductivity may instead be reversed.

A further epitaxial layer 3 is formed on the epitaxial layer 2 by an epitaxial growth of suitable semiconductor material, which may especially be the same kind of semiconductor material as the semiconductor material of the substrate 1, in particular silicon. The further epitaxial layer 3 is doped for the first type of electric conductivity.

A functional region 4 of the further epitaxial layer 3 is provided with a photodetector, which may be a photodiode, for instance, or with a plurality of photodetectors, which may form an array for image detection, for instance, and with components of an integrated circuit, which may be a CMOS circuit, for instance. The integrated circuit may be provided with a wiring, in particular a wiring comprising metal layers embedded in an intermetal dielectric, which may be arranged on the front surface 5 of the further epitaxial layer 3.

The functional region 4 may comprise separate sections for the accommodation of different elements. The elements provided in the functional region 4 may comprise any conventional components of photodetector devices known per se. Details of the functional region 4 are not relevant to the invention and need not be described here.

The sequence of the substrate 1 and the epitaxial layers 2, 3 form a structure of a bipolar transistor, which is a pnp bipolar transistor in the example shown in the FIGURE. The radiation that is to be detected is incident on the front surface 5 and reaches the region of the photodetector and the integrated circuit 4 without passing the epitaxial layer 2. The absorption of the radiation and the generation of electron-hole pairs $e^-/h^+$ from radiation incident from the rear side 6 are schematically indicated by arrows in the FIGURE. The epitaxial layer 2 stops the generated charge carriers at its boundaries and thus prevents the drift of the charge carriers into the functional region 4.

The epitaxial layer 2 and the further epitaxial layer 3 may be shorted and grounded by forming a trench 7, 7', which penetrates the further epitaxial layer 3 and the epitaxial layer 2 and reaches into the substrate 1, and arranging an electric conductor 8, 9 in the trench 7, 7'. Generated charge carriers $e^-$, $h^+$ will be removed by this electrically conductive structure. The trench 7, 7' can be etched in the semiconductor material of the further epitaxial layer 3 and the epitaxial layer 2 until the substrate 1 is reached.

The electric conductor can be electrically conductive polysilicon 8, for example, as shown at position a in the FIGURE. The trench 7 may be completely or partially filled by the polysilicon 8. The electric conductor can instead be a metallization 9. Such a metallization can be applied by chemical vapor deposition (CVD), in particular by a process according to tungsten deposition for vias in an intermetal dielectric, for instance. The trench 7' may be completely filled by the metallization 9. Instead, the metallization 9 may be applied as a layer on the wall and bottom of the trench 7', as shown at position b in the FIGURE. One of the trenches 7, 7' shown in the FIGURE at positions a and b will suffice, but both trenches 7, 7' may instead be present and provided with an electric conductor.

In further embodiments of the semiconductor photodetector device, a functional region including a photodetector or a plurality of photodetectors and/or an integrated circuit may be arranged in the substrate 1. The arrangement of the elements of the functional region may instead be divided between the substrate 1 and the further epitaxial region 3. In particular, photodiodes may be arranged in the further epitaxial region 3, and the integrated circuit in the substrate 1, for example. In each case the epitaxial layer 2 blocks the diffusion of charge carriers that are due to an undesired incidence of radiation from a side opposite the photodetector or plurality of photodetectors.

The proposed structure of the shielding layer yields a substantial improvement of the operation of a photodetector device that is exposed to undesired ambient light illumination.

The invention claimed is:
1. A semiconductor photodetector device, comprising:
   a substrate of semiconductor material of a first type of electric conductivity,
   an epitaxial layer on the substrate, the epitaxial layer being doped for a second type of electric conductivity, which is opposite to the first type of electric conductivity,
   a further epitaxial layer on the epitaxial layer, the further epitaxial layer being doped for the first type of electric conductivity, the epitaxial layer being arranged between the substrate and the further epitaxial layer,
   an electric conductor shorting the substrate, the epitaxial layer and the further epitaxial layer; and
   a photodetector or plurality of photodetectors arranged in the substrate or in the further epitaxial layer.
2. The semiconductor photodetector device of claim 1, wherein
   the photodetector or plurality of photodetectors is arranged in the further epitaxial layer.
3. The semiconductor photodetector device of claim 1, further comprising:
   a trench in the epitaxial layer and the further epitaxial layer, the trench reaching to the substrate, and
   a metallization in the trench forming the electric conductor.
4. The semiconductor photodetector device of claim 1, further comprising:
   a trench in the epitaxial layer and the further epitaxial layer, the trench reaching to the substrate, and
   a filling of electrically conductive poly silicon of the first type of conductivity in the trench forming the electric conductor.
5. The semiconductor photodetector device of claim 1, wherein
   the substrate is more highly doped for the first type of electric conductivity than the further epitaxial layer.
6. The semiconductor photodetector device of claim 1, wherein
   the first type of electric conductivity is p-type conductivity, and
   the second type of electric conductivity is n-type conductivity.
7. A semiconductor photodetector device, comprising:
   a substrate of semiconductor material, the substrate being doped for a first type of electric conductivity,
   an epitaxial layer on the substrate, the epitaxial layer being doped for a second type of electric conductivity, which is opposite to the first type of electric conductivity,
   a further epitaxial layer on the epitaxial layer, the further epitaxial layer being doped for the first type of electric conductivity, the epitaxial layer being arranged between the substrate and the further epitaxial layer,
   a trench in the epitaxial layer and the further epitaxial layer, the trench reaching to the substrate,
   an electric conductor in the trench, the electric conductor shorting the substrate, the epitaxial layer and the further epitaxial layer; and
   a functional region of the further epitaxial layer, the functional region including a photodetector or plurality of photodetectors and an integrated circuit.
8. The semiconductor photodetector device according to claim 7, wherein
   the substrate is more highly doped than the further epitaxial layer,
   the first type of electric conductivity is p-type conductivity, and the second type of electric conductivity is n-type conductivity.

\* \* \* \* \*